United States Patent [19]

Riggio, Jr.

[11] Patent Number: 5,528,137

[45] Date of Patent: Jun. 18, 1996

[54] NETWORK SENSITIVE PULSE GENERATOR

[75] Inventor: Salvatore R. Riggio, Jr., Boca Raton, Fla.

[73] Assignee: International Business Machines Corporation, Armonk, N.Y.

[21] Appl. No.: 377,547

[22] Filed: Jan. 24, 1995

[51] Int. Cl.⁶ .......................... G01R 27/26; G01R 31/02
[52] U.S. Cl. ...................... 324/158.1; 324/537
[58] Field of Search .................. 324/158.1, 72.5, 324/537, 678, 672, 60

[56] References Cited

U.S. PATENT DOCUMENTS

| | | | |
|---|---|---|---|
| 3,452,272 | 6/1969 | Collins et al. | 324/60 |
| 4,565,966 | 1/1986 | Burr et al. | 324/73 PC |
| 4,636,716 | 1/1987 | Welzhofer | 324/73 R |
| 4,714,875 | 12/1987 | Bailey et al. | 324/73 PC |
| 4,763,066 | 8/1988 | Yeung et al. | 324/73 R |
| 5,043,910 | 8/1991 | Chiba | 324/537 |
| 5,202,640 | 4/1993 | Schaaf et al. | 324/537 |
| 5,256,975 | 10/1993 | Mellitz et al. | 324/519 |
| 5,266,901 | 11/1993 | Woo | 324/537 |
| 5,268,645 | 12/1993 | Prokoff et al. | 324/537 |
| 5,402,072 | 3/1995 | Chiang et al. | 324/537 |

OTHER PUBLICATIONS

Article entitled "Measurement of Impedances Under Dynamic Pulse Conditions" IBM Technical Dislcosure Bulletin, vol. 8 No. 11, Apr, 1966, pp. 1507–1510.

Article entitled "Multi-Layer Printed Wiring Testers", RCA Technical Notes Periodical, Nathan S. Parks, Nov, 1965.

*Primary Examiner*—Kenneth A. Wieder
*Assistant Examiner*—Barry C. Bowser
*Attorney, Agent, or Firm*—Richard A. Tomlin; Peter M. Dichiara

[57] ABSTRACT

A network sensitive pulse generator circuit and a method of using the circuit to quickly detect faults in a net under test are described. The novel circuit generates pulses which depend upon the transient behavior of the net under test. The stimulation of the net and the sensing of the net's response operate responsively to a feedback signal, which is also a signature signal. By connecting the net under test to the novel circuit, the combination of the novel circuit and the net under test generates a series of output pulses. The number of pulses generated in a predetermined period of time forms the signature of the net under test. A preferred embodiment is described which uses differential amplifiers to stimulate the net and to sense the net's response. The differential amplifier which senses the net's response is connected to a circuit which produces the feedback/signature signal. The feedback/signal is then provide to the differential amplifiers to adjust their behavior.

17 Claims, 6 Drawing Sheets ns. 5,528,137

NETWORK SENSITIVE PULSE GENERATOR

FIELD OF THE INVENTION

This invention relates to testing an electrical net of an electrical or electronic circuit and, more particularly, to a method of and apparatus for quickly detecting fault conditions in individual wiring nets in a multi-layer device carrier, for example.

BACKGROUND OF THE INVENTION

In the electrical arts, the testing of electrical .nets. of an electrical or electronic circuit for fault conditions is universally recognized to be of high importance. Among other things, circuit manufacturers and purchasers want to test nets for .opens,. .shorts,. and other faulty characteristics, such as circuits having incorrect resistance, inductance, and capacitance characteristics (.RLC. characteristics). The term .net. is known in the art and generally refers to the electrical characteristics of a circuit as they appear from a given circuit node. These electrical characteristics are measured with reference to a predetermined reference point, e.g., ground. A circuit typically includes several nets of interest.

The prior art includes methods that subject the net under test to a sinusoidal input stimulus and then measure both the magnitude and phase of the net's response to the input stimulus. The magnitude and phase may then be analyzed to detect faults in the net. In addition, the prior art includes methods that directly measure the various RLC characteristics of a net to be tested.

Though the prior art methods are generally perceived as capable of detecting many types of faults, they have undesirable shortcomings. Among other things, certain nets, particularly those having large capacitances, require unduly long testing times. This is so, because the prior art methods must use a low frequency stimulus to ensure accurate measurement of a high capacitance. The low frequency results in longer testing times, and the longer testing times, in turn, increase the testing cost. This becomes particularly acute when high volume testing is required.

In addition, many prior art methods require a priori knowledge of the net configuration being tested, including knowledge of the arrangement of various components and their RLC characteristics. This complicates the testing, increases the cost, and in certain instances is entirely impracticable.

Further, many prior art methods are particularly configured to test nets having a relatively limited range of possible RLC characteristics. Consequently, manufacturers and purchasers are required to buy additional testing equipment, if they desire to test nets outside the limited range of their existing testers.

Accordingly, there is a need in the art for a method of an apparatus for testing nets quickly.

It is an object of the invention to provide a method and apparatus to detect faults a net quickly.

It is a further object of the invention to provide a method and apparatus to detect faults in a net without requiring a priori knowledge of the net to be tested.

it is yet a further object of the invention to provide a method and apparatus that can test a variety of nets having a wide range of RLC characteristics.

SUMMARY OF THE INVENTION

The present invention provides a novel network sensitive pulse generator circuit and a method of using the novel circuit to detect faults in a net under test. The novel network sensitive pulse generator is coupled to the net under test, and once coupled, the two form a .super circuit,. which acts as an oscillator and generates a pulse train, called a .signature. The generated signature is then compared with a known good signature. Faults are detected by detecting mismatches between the generated signature and the known good signature. This detection may allow for mismatches within a predetermined tolerance.

The net under test is connected to a variable current source which is, in turn, controlled by the output of the test circuit. Consequently, the aforementioned output pulse train will affect the current flowing through the net under test. This variable current generates a variable voltage across the net which voltage is sensed and used to control both the binary output and the current source.

One aspect of the invention also includes a novel arrangement for shifting signals from levels used in a bipolar junction technology (BJT) circuit to levels used in a CMOS technology circiut. This aspect includes an emitter follower circuit coupled to an input signal from a differential amplifier of BJT technology. The emitter of the emitter follower circuit is coupled to a bandgap voltage reference to drop the voltage of the emitter of the emitter follower by a predetermined amount, the dropped voltage being the converted CMOS signal. This aspect further includes a current sink for biasing the emitter follower and the band-gap voltage reference.

BRIEF DESCRIPTION OF THE DRAWING(S)

The above and further advantages of the invention may be better understood by referring to the following description in conjunction with the accompanying drawings in which.

DESCRIPTION OF THE PREFERRED EMBODIMENT(S)

This description first describes a novel network sensitive pulse generator circuit according to a preferred embodiment of the invention. Certain well-known components of this circuit embodiment, such as voltage references and current sources, are only briefly described to aid clarity. The operation of the circuit is then described, first generally and then in detail. Lastly, a method of using the novel circuit to quickly detect faults is described.

Figure 1:
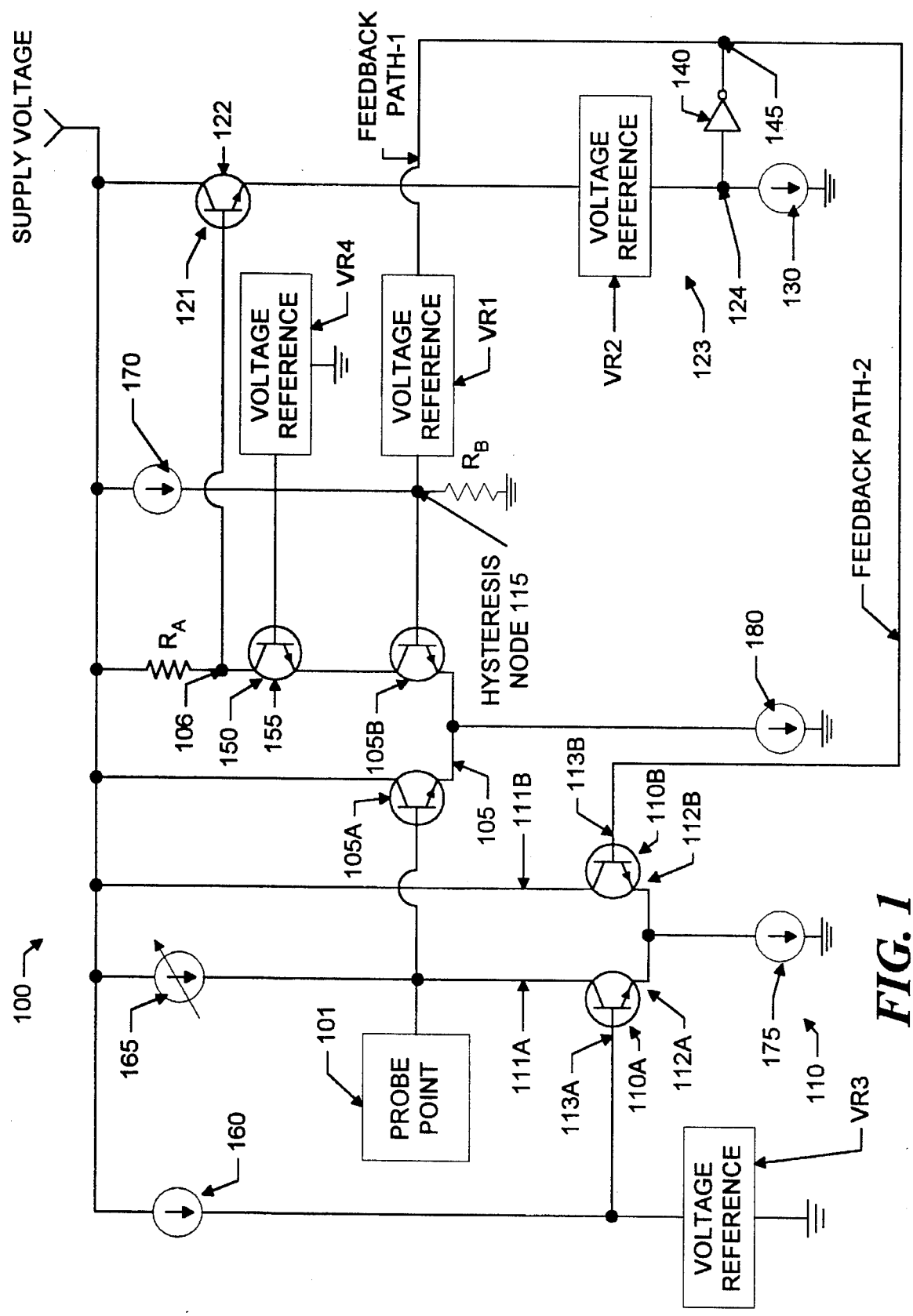
FIG. 1 illustrates a network sensitive pulse generator circuit according to a preferred embodiment of the invention.

FIG. 1 illustrates a novel network sensitive pulse generator circuit 100. Circuit 100 generally includes a first differential amplifier circuit 110, a second differential amplifier circuit 105, a voltage level shifter circuit 123, and an inverter circuit 140. The net to be tested is coupled to a probe point 101, for example via a connection cable (not shown).

The first differential amplifier 110 includes a first transistor 110A, a second transistor 110B, a user-adjustable current source 165, and a current sink 175. The transistors 110A and 110B are connected at their emitters 112A and 112B, respectively, which are coupled to current sink 175. In a preferred embodiment, current sink 175 draws 5 ma. Collector 111A of transistor 110A is coupled to current source 165 and to probe point 101. Current source 165, described below, is user adjustable to supply current from 0.4 ma to 2.5 ma and is coupled to a supply voltage, e.g., 15 volts in a preferred embodiment. A collector 111B of transistor 110B is coupled to the supply voltage. A base 113A of transistor 110A is coupled to a voltage reference VR3, described below, which in a preferred embodiment provides approximately 1.8 volts, and base 113A is also coupled to current supply 160, which in a preferred embodiment provides 1 ma. A base of transistor 110B is coupled to node 145 via feedback path-2.

Probe point 101 is also connected to a second differential amplifier 105, which generally comprises a first transistor 105A, a second transistor 105B, a current sink 180, a common base amplifier 150, and a resistor $R_B$. More particularly, collector 111A is coupled to a base of a first transistor 105A. The collector of transistor 105A is coupled to the supply voltage, and the emitter of transistor 105A is coupled to the emitter of second transistor 105B. The two emitters, in turn, are coupled to current sink 180, which in a preferred embodiment draws 0.5 ma. The collector of transistor 105B is coupled to a common base amplifier circuit 150, described below, which is coupled to the supply voltage, via resistor $R_A$. The base of transistor 105B is coupled to a .hysteresis. node 115, which is described below.

The common base amplifier 150 includes an npn-type transistor having its emitter coupled to node 106 and its collector coupled to resistor $R_A$. The base of transistor 155 is coupled to a voltage reference VR4, which is 7.4 volts in a preferred embodiment. The common base amplifier 150 improves the switching speed of second differential amplifier 105.

Node 115 is coupled to ground via resistor $R_B$ and is also coupled to a current source 170, which provides 5 ma in a preferred embodiment and which is also coupled to the supply voltage. Node 115 is further coupled to a voltage reference VR1, which is also coupled to node 145, which in a preferred embodiment causes node 115 to attain 3.0 volts, when VR1 is on. VR1 is further described below.

Collector node 106 of transistor 105B is coupled to the base 121 of transistor 122 of emitter follower circuit 120. Emitter follower circuits are known. A collector of transistor 122 is coupled to the supply voltage, and a an emitter of transistor 122 is coupled to a level shifter circuit 123.

Level shifter circuit 123 includes band-gap voltage reference VR2 and a current sink 130. As will be further described below, this level shifter in conjunction with the follower circuit 120 includes certain novel aspects, including an unusually fast response time for converting differential amplifier output signals to CMOS levels. Level shifter circuit 123 includes a node 124 between band-gap voltage reference VR2 and current sink 130. Band-gap voltage references are known in the art. Typically, they are depicted with symbols that appear similar to those used for zener diodes, except that they have a third terminal, see, e.g., FIG. 3. Unlike zener diodes, band-gap voltage references are relatively immune to temperature over a broad range of temperatures, and they are relatively immune to the amount of current flowing through the device.

An input of a CMOS inverter 140 is coupled to node 124, and an output node 145 of CMOS inverter 140 is coupled to several elements. First, the output 145 is connected, via feedback path-1, to voltage reference VR1. Second, output node 145 of CMOS inverter 140 is coupled to the base 113B of transistor 110B of first differential amplifier 110 via feedback path-2. Third, the output 145 of CMOS inverter 140 provides the output pulses of the super circuit and is connected to conventional pulse counting hardware and signal shaping hardware to provide the signature of the net coupled to probe point 101.

The operation of the circuit of FIG. 1 will now be described, first generally, and then more specifically. Generally, a net under test is coupled to probe point 101. The net under test is a multiple series-parallel RLC network and the actual construction and arrangement of the net need not be known a priori. However, portions of the net will be connected to a reference potential which is usually circuit ground. A .super circuit. is thus formed from the combination of the net under test and the novel network sensitive pulse generator circuit 100. As will be further described below, the super circuit behaves as an oscillator and produces a train of output pulses, or signature, at output node 145 where the frequency and duty cycle depend on the overall RLC time constants in the net under test.

Conventional pulse counting circuits may be coupled to node 145 to convert the output pulse train to a digital binary or hexadecimal signature number, for example. Alternatively, a testing system may directly receive and count the pulses from node 145. The signature or the signature number may then be analyzed by testing software, for example, by comparing it to a known good signature. The known good signature may be produced in similar manner, i.e., by connecting a known good device to the novel circuit 100, or it may be provided by the manufacturer of the circuit being tested.

More specifically, connecting the net under test to probe point 101 places the multiple series-parallel RLC network of the net between the probe point 101 and a test reference point, e.g., ground. The probe point 101 is connected to a variable current source which is, in turn, controlled by the output of the test circuit. Consequently, the aforementioned output pulse train will affect the current flowing through the net under test. This variable current generates a variable voltage across the net which voltage is sensed and used to control a binary output. The super circuit contains a feedback loop so that a high output signal reduces the current being applied to the net under test. The reduced current, in turn, causes the voltage to decrease across the net. When the voltage decreases to a predetermined level, a low output signal is generated and the current source is controlled to increase the current applied to the net. In response, the voltage across the net increases until a second predetermined level is reached at which point a low output signal is generated. This process is repeated to generate a series of pulses with characteristics that are dependent on the net under test.

Now the operation of the circuit will be described more specifically. The probe point 101 is connected to a differential amplifier in the test circuit 100. As described above, a preferred embodiment of circuit 100 uses two differential amplifier circuits, constructed from npn-type transistors. Though the operation and behavior of differential amplifiers are known in the art, a brief review is provided to aid clarity. A differential amplifier, constructed of BJT technology, receives voltage signals at the base junctions of each transistor of the differential amplifier. The current in the collector of each transistors is then .steered. according to a known relationship, which depends on the voltage difference between the base junctions. The transistor having a higher base junction voltage of the two will attain a higher collector current. Consequently, the current from the current sink will split between the net under test and the current running through the differential amplifier. As will hereinafter be described, the differential amplifier is also connected to the circuit output. Consequently, the output pulse train will affect the current flowing through the differential amplifier The second differential amplifier 105 senses the voltage level at the probe point 101, as a function of time, and provides an output voltage at node 106 that depends on the amount of collector current of transistor 105B. The amount of collector current, in turn, depends on the voltage difference across the base junction of transistors 105A and 105B, i.e., the net under test's voltage and the voltage at hysteresis node 115.

The output 106 of the second differential amplifier 105 is coupled to an emitter follower circuit 120. The emitter follower circuit 120 is coupled to a level shifter circuit 123, which shifts the voltage signal provided by the emitter of transistor 122 to a compatible voltage for CMOS inverter 140. Thus, the differential amplifier 105 signal from node 106 is made compatible with CMOS.

The CMOS inverter 140 generates CMOS logic level output pulses at node 145. As is known in the art, CMOS inverter 140 drives output signals rail-to-rail,. i.e., 0 to 5 volts, and CMOS circuits are capable of sinking and sourcing equal amounts of current. These aspects of CMOS inverters were found to improve the performance of the circuit 100, without causing instability in the production of signature pulses. That is, at the preferred speed of operation, 1.8 Mhz, the sharp rise time and other characteristics of a CMOS signal in conjunction with the characteristics, described above, were found to alleviate problems of signature drift (i.e., the possibility of a same net producing two signatures).

The output pulses from inverter 140, when changed, change the voltage level at the second differential amplifier 105, via voltage reference VR1, described below, as well as changing the level of current applied to the net under test at the probe point 101, by changing the voltage at the base 113B of transistor 110B of the first differential amplifier 110.

The voltage at the probe point 1 01, i.e., the response of the net under test, rises and falls, as a function of time, depending upon three general factors:

(1) the configuration and component values of the multiple series-parallel RLC net under test connected between the node 101 and the reference point, e.g., ground;

(2) the magnitude and direction of the current entering or leaving the probe point, which, in turn, depends upon the behavior of the first differential amplifier 110, which, in turn, depends on the relationship of the base junction voltages; and (3) the upper and lower hysteresis voltage values present at the hysteresis node 115.

The upper hysteresis voltage value is equal to the voltage drop across resistor $R_B$. This occurs when VR1 is off. As such, the upper hysteresis voltage equals the product of the value of the current source 170 entering the hysteresis node 115, 5 ma, and the value of resistor $R_B$ (1K ohm ). The lower hysteresis voltage value is equal to the value of voltage reference VR1, which in a preferred embodiment equals 3.0 volts. The operation of voltage reference VR1 is further described below.

When the voltage at the probe point 101 becomes slightly less than the lower hysteresis voltage value at the hysteresis node 115, the collector current of transistor 105B increases. The increased current causes the voltage drop across resistor $R_A$ to increase, which causes the voltage at node 106 to drop. This, in turn, causes the voltage at the emitter of the transistor 122 to be lowered. The emitter voltage of transistor 122 is then shifted by band-gap voltage reference VR2 of level shifter 123 to a voltage that is compatible with CMOS inverter 140. More particularly, the voltage level shift causes the voltage at the input 124 of CMOS inverter 140 to be approximately 0 volts, i.e., logic level .0. As such, the output 145 of the CMOS inverter 140 becomes logic level one, e.g., 5 volts. This represents the first of a series of pulses that are continuously generated.

When the output 145 of the CMOS inverter 140 moves to 5 volts, it also resets the voltage value at the hysteresis node 115 to the upper hysteresis voltage value by turning off VR1. Output node 145 attaining a 5 volt level also changes the magnitude and direction of the current stimulating the net under test at the probe point 101 by changing the value on base 113B of transistor 110B of first differential amplifier 110. More particularly, supplying 5 volts to base 113B causes more current to flow in collector 111B and less current to flow in collector 111 A, because the 5 volts at 113B is higher than the voltage provided by VR3, e.g., 1.8 volts.

Less current in collector 111A causes a smaller voltage drop from the net under test and thus causes the voltage at the probe point 101 to move upward in value, as a function of time. When the voltage at collector 111A and the base of transistor 105A becomes slightly greater in value than voltage at hysteresis node 115, which is now the upper hysteresis voltage value, more current is drawn in the collector of transistor 105A and less current from the collector of transistor 105B. A lower current in the collector 105B causes a lower voltage drop across resistor $R_A$ and thus causes the voltage at node 106 to rise. As such, the voltage at the emitter of transistor 122 rises in value. The common base amplifier 150 improves the speed of second differential amplifier 105.

The level shifter 123 is coupled to the emitter of transistor 122 and shifts the emitter voltage value via band-gap voltage reference VR2 to a value at node 124 to a CMOS compatible level, i.e., approximately 5 volts. This causes the output 145 of the CMOS inverter 140 to become 0 volts. The zero volts is fed back to VR1 and the base 113B to adjust the sensing of the net's response by differential amplifier 105 and to adjust the stimulation of the net by differential amplifier 110. This completes one cycle of operation, which generates one output pulse from logic 1 to logic 0.

The amount of time it takes for the probe point 101 to change in value sufficient to change the steering relationship of the second differential amplifier 105 and thus change the pulse at node 145 depends upon the transient behavior of the multiple series-parallel RLC circuit of the net under test and the amount of current being steered in the first differential amplifier 110. In a given amount of time, the super circuit produces a given number of pulses at node 145. In a preferred embodiment, 2 milliseconds is used to generate a signature. Moreover, in a preferred embodiment the super circuit may operate at up to 1.8 MHz, which may generate up to 3600K pulses in the 2 ms period.

If the net under test is different in any way from a known good net, the time with which it takes to complete a cycle of operation, discussed above, changes. More specifically, if the net under test is defective, the time constant characterizing the multiple series-parallel RLC arrangements of the net under test changes. The changed time constant changes the amount of time necessary to complete a cycle of operation described above, and this causes the defective net to produce a different number of pulses in the fixed period of the test, thus producing a different signature, which is defined as the number of pulses produced in the fixed period.

The configuration and component values of the net under test need not be known by the test operator. Any defects to the net under test, e.g., defects in the component values or configuration, are recognized by the super circuit generating a signature that is different than a known good signature. Given the high speed of operation and the high number of pulses generated in a fixed time, the circuit 100 may generate relatively precise signatures. When comparing the signature of the net under test to the good signature, the test operator may wish to incorporate a certain amount of tolerance in mismatched signatures. As stated above, the RLC characteristics of a particular net, or the sinusoidal impedance of the net, are not measured. Rather, the signatures depend upon the transient behavior of the net under test in conjunction with the novel network sensitive pulse generator circuit 100.

Now, exemplary constructions of the various abstracted components of FIG. 1 are described.

Current sinks 175 and 180 are conventional and are implemented by biasing base junctions of npn transistors (not shown) with a predetermined voltage, e.g., 1.2 volts. The collectors of the transistors are coupled to respective differential amplifiers, and the emitters are coupled to ground via biasing resistors. In a preferred embodiment current sink 175 draws 5 ma and current sink 180 draws 0.5 me.

Current sink 130 (1 ma)is also conventional. A npn transistor (not shown) has its base biased with an op-amp (not shown), which is biased to cause the transistor to be in a conductive state. The collector of the transistor is coupled to node 124 and the emitter is coupled to a negative power supply, e.g.,−15 volts.

Likewise, current sources 160 (5 ma) and 170 (5 ma) are conventional. A preferred embodiment, for example, uses the current sources depicted in FIG. 2A. Current source 200 includes an op amp 201, which receives a predetermined voltage, e.g., 5 volts, between the supply voltage input and the positive input, and which has its negative input coupled to the emitter junction of a pnp transistor 202. The collector of transistor 202 provides the current I.

Figures 2A, 2B:
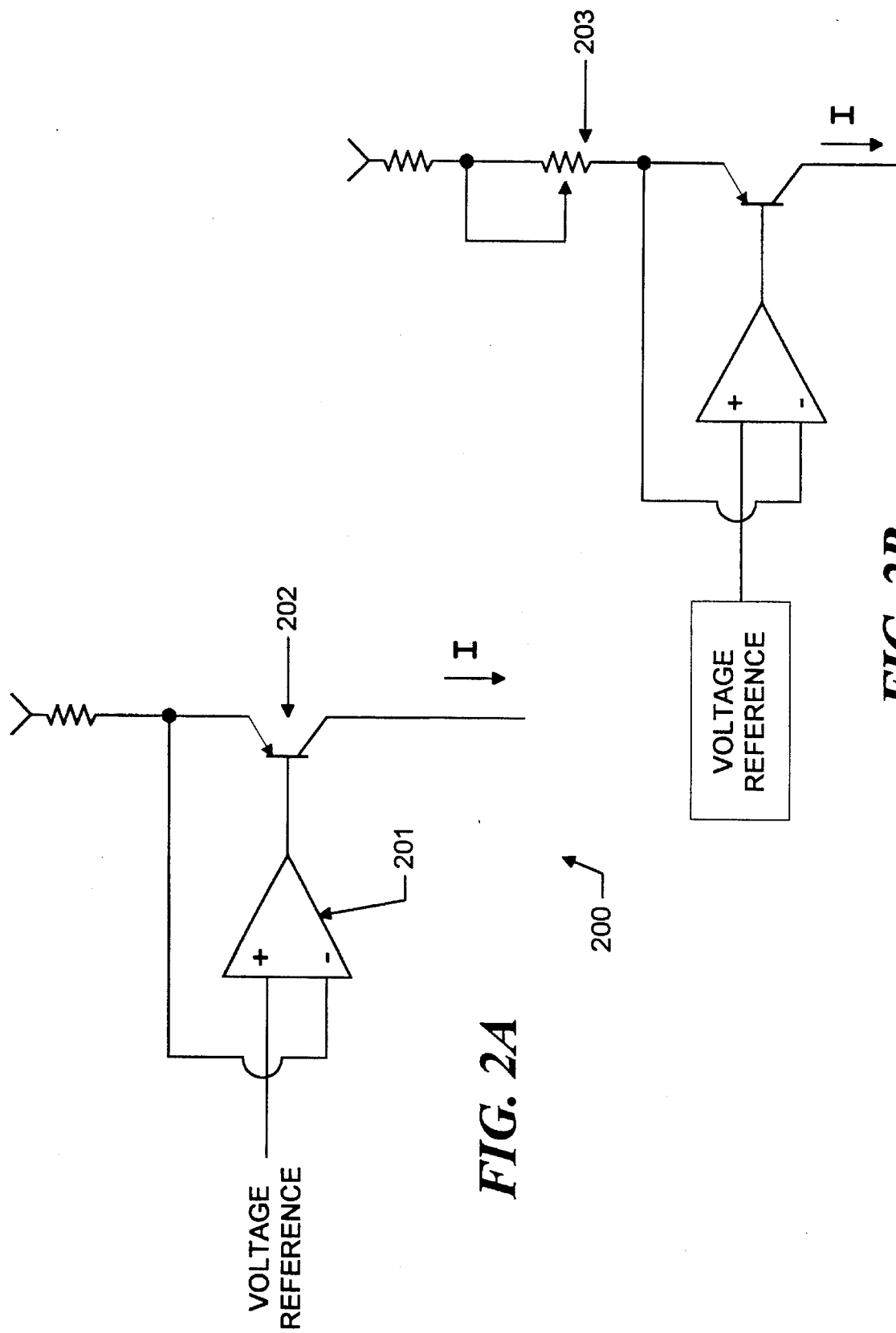
FIG. 2A illustrates current source circuits according to a preferred embodiment of the invention.
FIG. 2B illustrates another current source according to a preferred embodiment of the invention.

FIG. 2B illustrates a preferred embodiment of current source 165, which is user modifiable via potentiometer 203. User adjustment may be needed to calibrate the system for variances in the characteristics of a cable which may be used to couple the net under test to the probe point 101. Increasing or reducing the resistance of potentiometer 203 causes less or more current to flow from source 165, which changes the speed of operation of the super circuit. As such, a system may be calibrated by leaving the probe unconnected and adjusting the potentiometer 203 such that a maximum count signature, e.g., 3600K, is produced in a fixed time, e.g., 2 ms.

Figure 3:
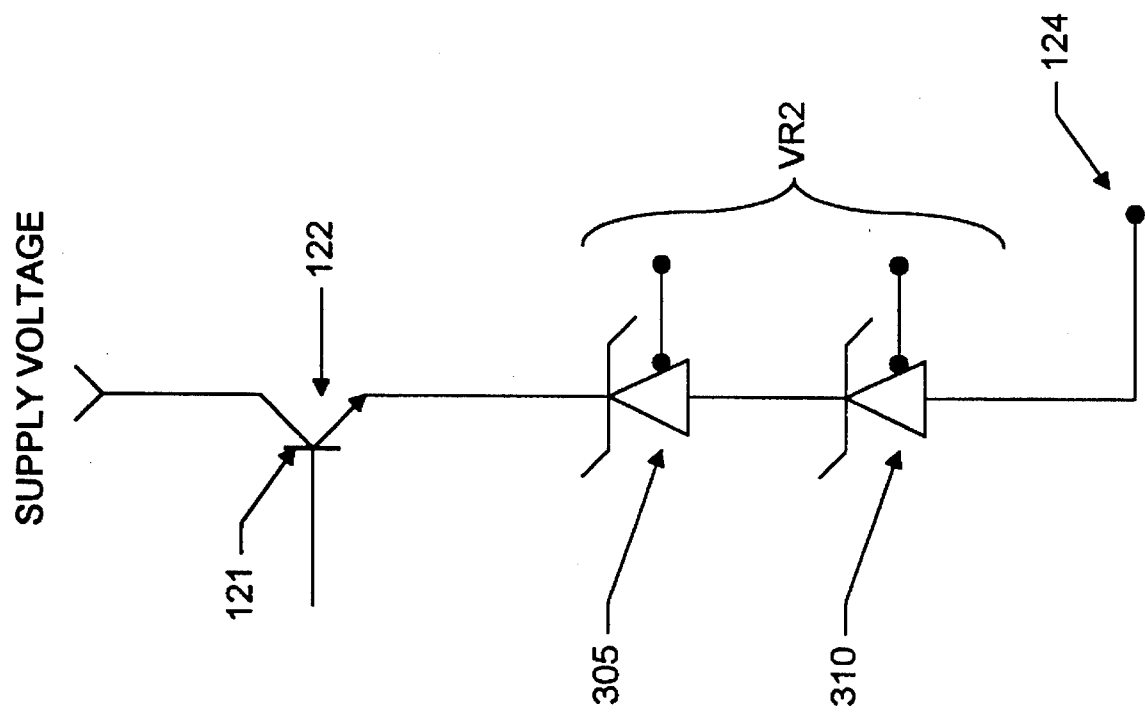
FIG. 3 illustrates a voltage reference circuit according to a preferred embodiment of the invention.

Referring to FIG. 3, a preferred implementation of voltage reference VR2 is illustrated. VR2 uses two band-gap voltage references 305 and 310 to drop the emitter voltage of transistor 122 a total of 10 volts. As suggested above, level shifter 123 includes certain novel aspects. Typical level shifters are formed from zener diodes and resistors; sometimes they are formed with resistors and current sinks or sources. In contrast, the level shifter 123 shifts the signal from node 106 with a follower circuit 120, band-gap voltage reference VR2, and a current sink 130, described above. This arrangement yields a much improved switching response time, which improves the performance of circuit 100.

Figure 4:
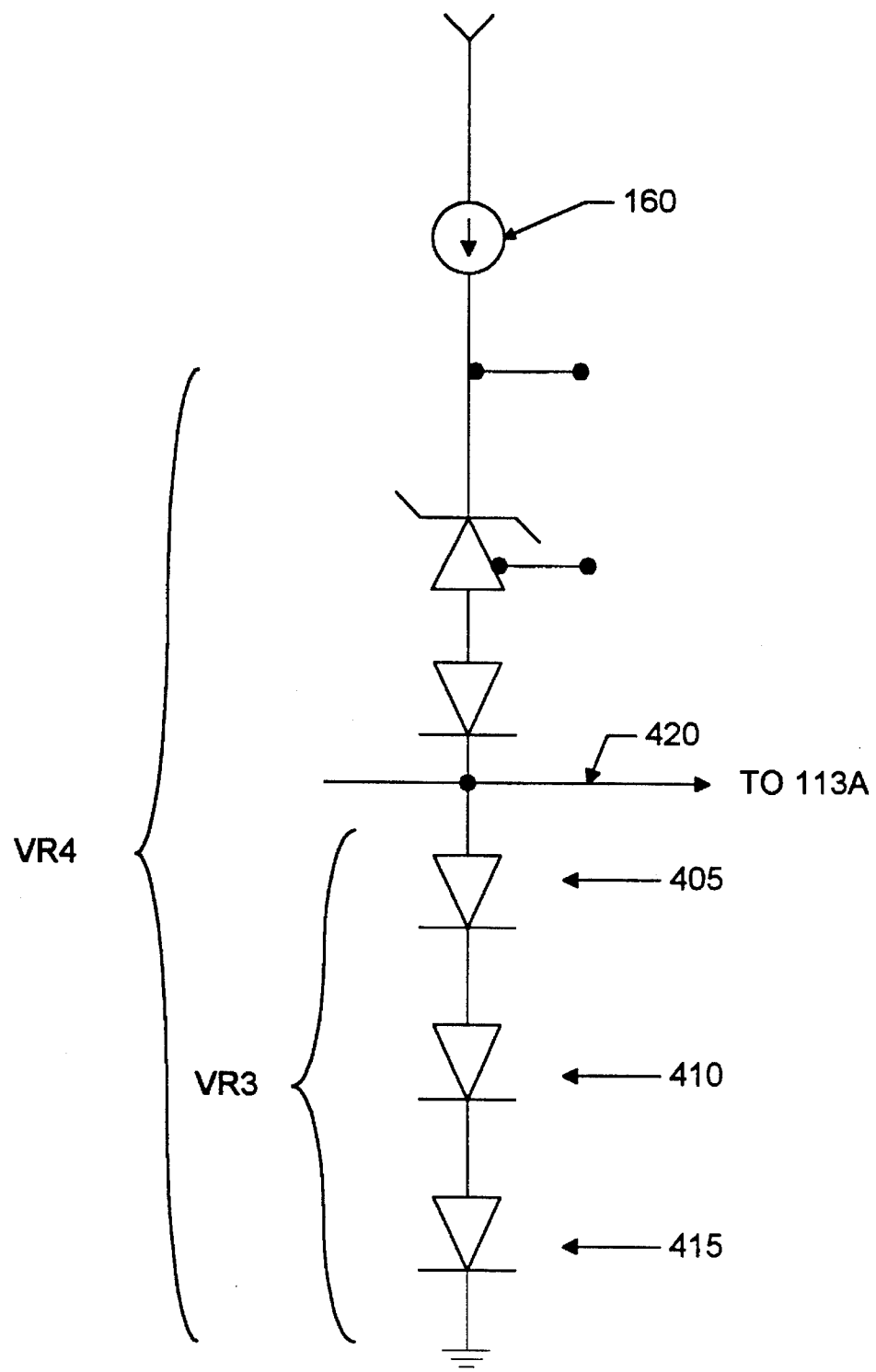
FIG. 4 illustrates another voltage reference circuit according to a preferred embodiment of the invention.

Referring to FIG. 4, a preferred implementation of voltage reference VR3 is illustrated. VR3 uses 3 diodes 405, 410, and 415, in which anode of diode 405 is coupled to the voltage reference point 420, which is coupled to base 113A (see also FIG. 1 ). Each diode is then series connected, anode to cathode, to provide a voltage at 420, depending upon the voltage drop of each diode, e.g., 0.6 volts.

Figure 5:
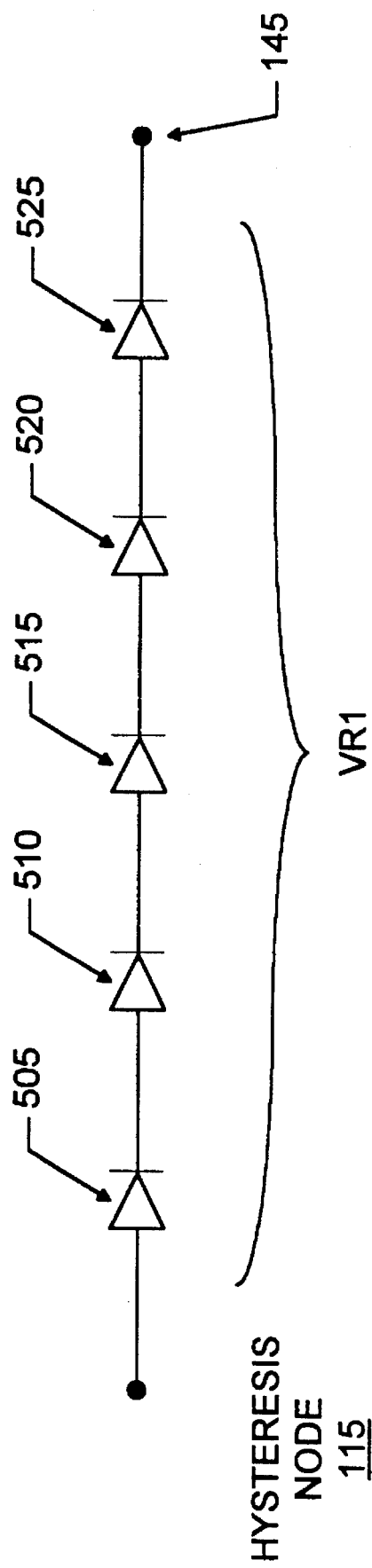
FIG. 5 illustrates another voltage reference circuit according to a preferred embodiment of the invention.

Referring to FIG. 5, a preferred implementation of voltage reference VR1 is illustrated. VR1 is formed by a series connection of five diodes 505–525, each having its cathode connected to an anode of a subsequent diode, the cathode of diode 525 being connected to node 145 (see also FIG. 1) and the anode of diode 505 being connected to node 115 (see also FIG. 1). Consequently, when node 145 is at zero volts, the diodes are biased so that each experiences a corresponding voltage drop, e.g., 0.6 volts. This causes VR1 to produce a predetermined voltage at node 115 of approximately 3.0 volts. When node 145 is at 5 volts, the diodes are off and thus VR1 is turned off. Thus, as seen from FIG. 1, the voltage at node 115 is determined from the value of the current source 170 multiplied by the value of the resistor $R_B$.

VR4 is constructed of band-gap voltage references and diodes to provide a voltage of 7.4 volts (see FIG. 4).

Figure 6:
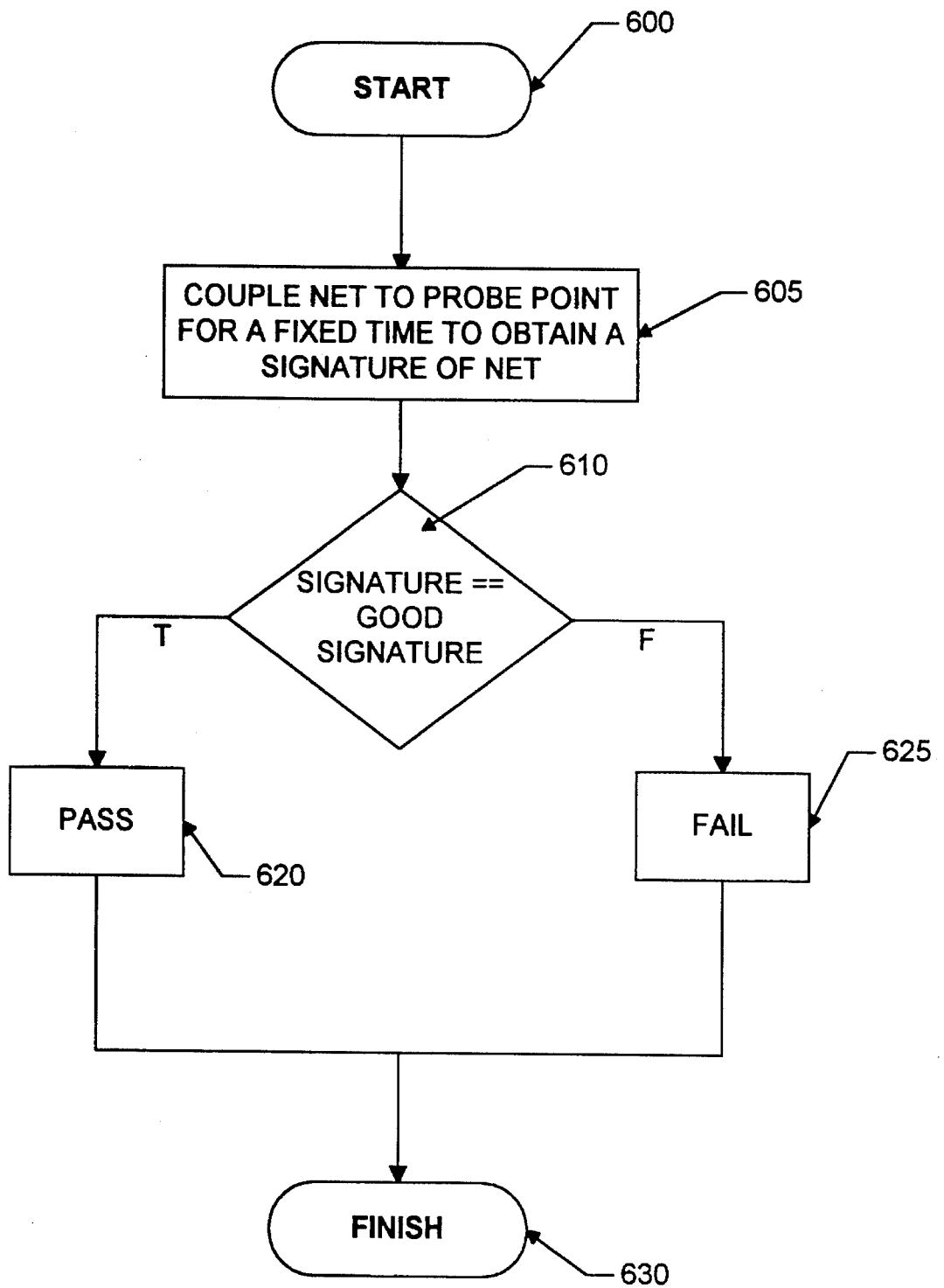
FIG. 6 is a flowchart illustrating a method of using the circuit according to a preferred embodiment of the invention.

Now a method of using the novel circuit 100 to quickly test nets for faults will be described with reference to the flowchart of FIG. 6. The test begins with step 600 and proceeds to step 605, in which a net is coupled to probe point 101 of circuit 100 (see FIG. 1) for the fixed time to determine the signature of the net under test. This signature consists of the output pulses generated at node 145 within the fixed time. This signature may be obtained by a testing system counting the pulses. Alternatively, conventional counting circuits may be used to count the pulses and provide a binary or hexadecimal count. This count may then be read by the testing system.

In step 610, the just obtained signature is compared to a known good signature. A known good signature may be obtained by coupling a known good net to the circuit 100 of FIG. 1 for a fixed time, e.g., 2 ms and recording the result. Alternatively the known good signature may be provided by the circuit manufacturer, or it may be theoretically determined through computer simulation of the electrical circuit. If the signatures match within a predetermined tolerance, a pass is indicated in step 620. If they do not, a failure is indicated in step 625. The flow then ends in step 630.

The foregoing description has been focused upon a specific embodiment, and certain variations, of the invention. Other variations and modifications, however, may be made to this embodiment, which will attain some or all of the advantages of the invention. The present invention, however, applies to present and future technologies which may be used instead of these technologies. It is, therefore, an object of the appended claims to cover all such variations and modifications that come within the true spirit and scope of the invention.

For example, though the circuit 100 is illustrated with npn-type transistors, other configurations will become apparent to those skilled in the art upon reading this description. For example, equivalent pnp-type transistor circuit configurations are also possible. Likewise, op-amps may be substituted into the design, and certain applications may find it beneficial to implement the concept of the invention in other technologies such as MOS. Moreover, the preferred implementation uses a CMOS inverter in conjunction with the novel level shifter circuit and also uses a common base amplifier in conjunction with the second differential amplifier. These components were found to improve the performance of the circuit, as described above. The inventive concept, described above, includes alternative arrangements which exclude these features.

What is claimed is:

1. Apparatus for generating unique binary signature signals indicative of the electrical characteristics of an electrical net, the apparatus comprising:

means, responsive to the signature signals, for applying a stimulus having a magnitude to the net, the applying means reducing the stimulus magnitude in response to a signature signal having a first level and increasing the stimulus magnitude in response to a signature signal having a second level; and means, responsive to a magnitude of a net response to the stimulus, for generating the signature signals, the generating means constructed to generate a signature signal having a first level when the net response magnitude increases to a first threshold and to generate a signature signal having a second level when the net response magnitude decreases to a second threshold.

2. The apparatus of claim 1 wherein the generating means comprises means connected to the net for sensing a response of the net to the stimulus.

3. The apparatus of claim 1 wherein the applying means applies a current stimulus to the net and the generating means comprises means for sensing the transient behavior of the net in response to the current stimulus.

4. The apparatus of claim 3 wherein the sensing means comprises means responsive to a voltage magnitude across the net.

5. The apparatus of claim 1 further comprising timing means for determining a time interval during which signature signals are generated in order to produce a unique signature for the net.

6. A method for generating unique binary signature signals indicative of the electrical characteristics of an electrical net, the method comprising the steps of:

A. applying a stimulus having a magnitude to the net;

B. reducing the stimulus magnitude in response to a signature signal having a first level;

C. increasing the stimulus magnitude in response to a signature signal having a second level;

D. generating a signature signal having a first level when the net response magnitude increases to a first threshold; and E. generating a signature signal having a second level when the net response magnitude decreases to a second threshold.

7. The method of claim 6 wherein step C senses the transient behavior of the net in response to a current stimulus provided by step A.

8. Apparatus for providing a signature indicative of a net, the signature being comprised of signature signals, said apparatus comprising:

means for coupling the net to the apparatus;

a first circuit coupled to the means for coupling and including means for stimulating the net in response to a feedback signal;

a second circuit coupled to the net and also coupled to a hysteresis node, the second circuit including means for providing a signal indicative of a response of the net to the stimulation provided by the first circuit, the second circuit operating responsively to a voltage at the hysteresis node and the response of the net;

a third circuit coupled to the hysteresis node and to the feedback signal, the third circuit including means for forcing the hysteresis node to a high voltage, when the feedback signal has a first state, and for forcing the hysteresis node to a low voltage, when the feedback signal has a second state; and a fourth circuit coupled to the signal indicative of a response of the net, provided by the second circuit, and including means for providing the feedback signal such that the feedback signal has the first state, when the signal indicative of a response of the net has a lower value, and has the second state, when the signal indicative of a response of the net has a higher value, wherein the feedback signal is a signature signal and the signature is formed by a series of feedback signals provided in a predetermined amount of time.

9. The apparatus of claim 8 wherein the first circuit comprises a first differential amplifier circuit having a collector of a first transistor coupled to the means for coupling and having a base of the first transistor coupled to a predetermined voltage reference and having a base of a second transistor coupled to the feedback signal.

10. The apparatus of claim 8 wherein the second circuit includes a second differential amplifier having a base of a first transistor coupled to the net and a base of a second transistor coupled to the hysteresis node, a collector of the second transistor providing the signal indicative of a response of the net.

11. The apparatus of claim 8 wherein the third circuit includes a current source for providing current into the hysteresis node and a resistor for biasing the hysteresis node to a high voltage and wherein the third circuit includes a diode series coupled to the hysteresis node and the feedback signal such that when the feedback signal has the first state the diode series is non-conductive and the hysteresis node obtains the high voltage, which depends upon the current source and the resistor, and such that when the feedback signal has the second state the diode series is conductive which forces the hysteresis node to the low voltage, which depends upon the diode series.

12. The apparatus of claim 8 wherein the fourth circuit includes an emitter follower circuit having a base of a transistor of the emitter follower circuit coupled to the signal indicative of a response of the net and an emitter of the transistor coupled to a band-gap voltage reference, the band-gap voltage reference being further coupled to a current sink, and a node, defined as being between the band-gap voltage reference and the current sink, the node being coupled to an input of a logical inverter, the output of the logical inverter providing the feedback signal.

13. The apparatus of claim 9 wherein the collector of the first transistor is coupled to a user-modifiable current source.

14. The apparatus of claim 10 wherein the collector of the second transistor is coupled to a common base amplifier.

15. The apparatus of claim 12 wherein the inverter is of CMOS technology.

16. A method of providing a signature indicative of a net, the signature being comprised of signature signals, the method comprising the steps of:

A. stimulating the net in response to a feedback signal;

B. providing a signal indicative of a response of the net to the stimulation provided by step A in response to a hysteresis value and in response to the response of the net;

C. forcing the hysteresis value to a high value when the feedback signal has a first state;

D. forcing the hysteresis value to a low value when the feedback signal has a second state;

E. providing the feedback signal, which is also a signature signal, such that the feedback signal has the first state when the signal indicative of a response of the net provided by step B has a lower value and such that the feedback signal has the second state when the signal indicative of a response of the net provided by step B has a higher value; and F. repeating steps A–E for a predetermined period of time so as to result in a series of signature signals forming the signature.

17. An apparatus for converting an input signal from a differential amplifier of BJT technology to an output signal compatible with CMOS logic levels, comprising:

an emitter follower circuit coupled to the input signal;

a band-gap voltage reference coupled to the emitter of the emitter follower so as to drop the voltage of the emitter of the emitter follower by a predetermined voltage, the dropped voltage being the output of the apparatus; and a current sink for biasing the emitter follower and the bandgap voltage reference.

* * * * *